United States Patent
Kim et al.

(10) Patent No.: US 12,164,783 B2
(45) Date of Patent: Dec. 10, 2024

(54) CROSS-TEMPERATURE COMPENSATION BASED ON MEDIA ENDURANCE IN MEMORY DEVICES

(71) Applicant: Micron Technology, Inc., Boise, ID (US)

(72) Inventors: Hyungseok Kim, Santa Clara, CA (US); Vamsi Pavan Rayaprolu, Santa Clara, CA (US); Sampath K. Ratnam, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 190 days.

(21) Appl. No.: 17/897,784

(22) Filed: Aug. 29, 2022

(65) Prior Publication Data

US 2024/0069745 A1    Feb. 29, 2024

(51) Int. Cl.
| | | |
|---|---|---|
| G11C 7/04 | (2006.01) | |
| G06F 3/06 | (2006.01) | |
| G11C 16/08 | (2006.01) | |
| G11C 16/26 | (2006.01) | |

(52) U.S. Cl.
CPC .......... *G06F 3/0619* (2013.01); *G06F 3/0611* (2013.01); *G06F 3/0629* (2013.01); *G06F 3/0679* (2013.01); *G11C 7/04* (2013.01); *G11C 16/08* (2013.01); *G11C 16/26* (2013.01)

(58) Field of Classification Search
CPC ....................................................... G11C 7/04
See application file for complete search history.

(56) References Cited

U.S. PATENT DOCUMENTS

| | | | | |
|---|---|---|---|---|
| 10,276,233 | B1* | 4/2019 | Danjean | G11C 11/5642 |
| 2009/0290432 | A1* | 11/2009 | Park | G11C 16/26 |
| | | | | 365/185.25 |
| 2011/0225350 | A1* | 9/2011 | Burger, Jr. | G11C 16/0483 |
| | | | | 711/E12.008 |
| 2011/0246859 | A1* | 10/2011 | Haratsch | H03M 13/47 |
| | | | | 714/780 |
| 2012/0213004 | A1* | 8/2012 | Yun | G11C 16/26 |
| | | | | 365/185.11 |
| 2014/0006688 | A1* | 1/2014 | Yu | G06F 12/0246 |
| | | | | 365/185.03 |
| 2014/0321209 | A1* | 10/2014 | Yun | G11C 16/3404 |
| | | | | 365/185.12 |
| 2015/0279472 | A1* | 10/2015 | Jones | G11C 16/24 |
| | | | | 365/185.19 |
| 2017/0345510 | A1* | 11/2017 | Achtenberg | G11C 16/3413 |
| 2019/0392907 | A1* | 12/2019 | Her | G06F 3/0659 |

(Continued)

*Primary Examiner* — Douglas King
(74) *Attorney, Agent, or Firm* — Lowenstein Sandler LLP

(57) ABSTRACT

An example method of performing read operation comprises: receiving a read request with respect to a set of memory cells of a memory device; determining a value of a media endurance metric of the set of memory cells; determining a programing temperature associated with the set of memory cells; determining a current operating temperature of the memory device; determining a voltage adjustment value based on the value of the media endurance metric, the programming temperature, and the current operating temperature; adjusting, by the voltage adjustment value, a bitline voltage applied to a bitline associated with the set of memory cells; and performing, using the adjusted bitline voltage, a read operation with respect to the set of memory cells.

20 Claims, 5 Drawing Sheets

(56) References Cited

U.S. PATENT DOCUMENTS

| | | | |
|---|---|---|---|
| 2021/0182166 A1* | 6/2021 | Hahn | G06F 11/3034 |
| 2022/0075687 A1* | 3/2022 | Jain | G06F 11/1068 |
| 2023/0197175 A1* | 6/2023 | Prakash | G11C 29/028 |
| | | | 365/185.22 |
| 2024/0036753 A1* | 2/2024 | Chin | G06F 3/0679 |
| 2024/0095112 A1* | 3/2024 | Takada | G06F 11/073 |

* cited by examiner

| # of PEC | PEC1 | PEC2 | PEC3 | PEC4 | PEC5 | PEC 6 | PEC 7 | PEC 8 |
|---|---|---|---|---|---|---|---|---|
| Hot/Hot | $BTV_{11}$ | $BTV_{12}$ | | | | | | $BTV_{1N}$ |
| Hot/Cold | $BTV_{21}$ | | | | | | | |
| Cold/Cold | | | | | | | | |
| Cold/Hot | $BTV_{M1}$ | $BTV_{M2}$ | | | | | | $BTV_{MN}$ |

CROSS-TEMPERATURE COMPENSATION BASED ON MEDIA ENDURANCE IN MEMORY DEVICES

TECHNICAL FIELD

Implementations of the disclosure relate generally to memory sub-systems, and more specifically, relate to cross-temperature compensation based on media endurance in memory devices.

BACKGROUND

A memory sub-system may include one or more memory devices that store data. The memory devices may be, for example, non-volatile memory devices and volatile memory devices. In general, a host system may utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various implementations of the disclosure. The drawings, however, should not be taken to limit the disclosure to the specific implementations, but are for explanation and understanding only.

FIG. 3 schematically illustrates an example voltage adjustment data structure implemented in accordance with aspects of the present disclosure.

DETAILED DESCRIPTION

Figure 1:
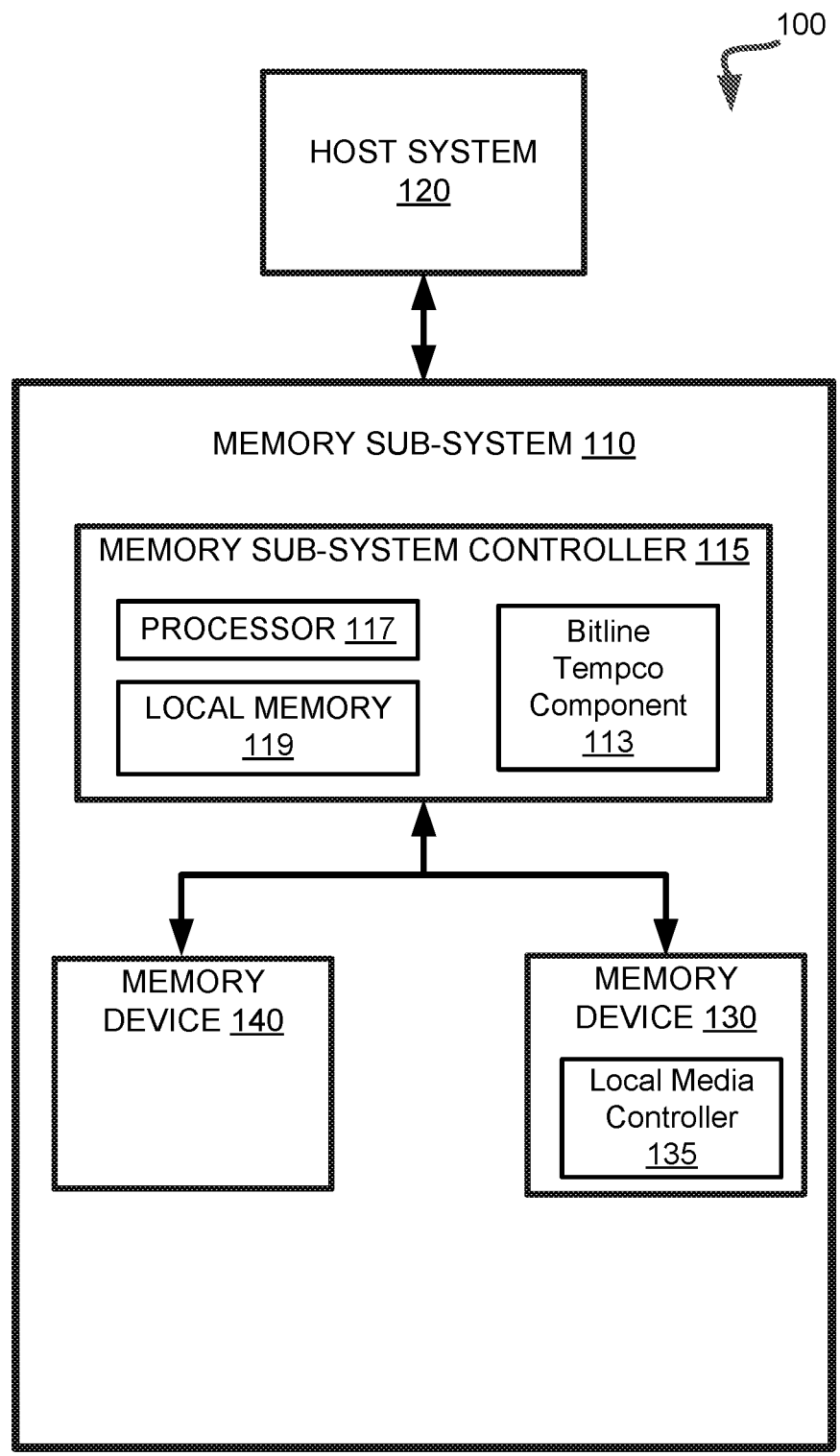
FIG. 1 illustrates an example computing system that includes a memory sub-system in accordance with some implementations of the present disclosure.

Aspects of the present disclosure are directed to cross-temperature compensation based on media endurance in memory devices. A memory sub-system may be a storage device, a memory module, or a combination of a storage device and memory module. Examples of storage devices and memory modules are described below in conjunction with FIG. 1. In general, a host system may utilize a memory sub-system that includes one or more components, such as memory devices that store data. The host system may provide data to be stored at the memory sub-system and may request data to be retrieved from the memory sub-system.

A memory sub-system may include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die may consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell may store one or more bits of binary information, and has various logic states that correlate to the number of bits being stored. The logic states may be represented by binary values, such as "0" and "1", or combinations of such values.

A memory device includes multiple memory cells arranged in a two-dimensional or three-dimensional grid. Memory cells are formed on (e.g., etched onto) a silicon wafer in an array of columns connected by conductive lines ("bitlines") and rows connected by conductive lines ("wordlines"). A wordline is a conductive line that connects control gates of a set (e.g., one or more rows) of memory cells of a memory device. The intersection of a bitline and wordline constitutes the address of the memory cell. A block is a portion of the memory device used to store data and may include a group of memory cells, a wordline group, a wordline, or individual memory cells. One or more blocks may be grouped together to form separate partitions (e.g., planes) of the memory device in order to allow concurrent operations to take place on each plane. The memory device may include circuitry that performs concurrent memory page accesses of two or more memory planes. For example, the memory device may include a respective access line driver circuit and power circuit for each plane of the memory device to facilitate concurrent access of pages of two or more memory planes, including different page types. In another example, the memory device may include multiple access line driver circuits and power circuits that may be shared by the planes of the memory device. For ease of description, these circuits may be generally referred to as independent plane driver circuits. Depending on the storage architecture employed, data may be stored across the memory planes (i.e., in stripes). Accordingly, one request to read a segment of data (e.g., corresponding to one or more data addresses), may result in read operations performed on two or more of the memory planes of the memory device.

A memory cell may be programmed (written to) by applying a certain voltage to the memory cell, which results in an electric charge being held by the memory cell. For example, a voltage signal VCG that may be applied to a control electrode of the cell to open the cell to the flow of electric current across the cell, between a source electrode and a drain electrode. More specifically, for each individual memory cell there may be a threshold control gate voltage $V_T$ (herein also referred to as the "threshold voltage"). The memory cells may be characterized by a distribution of the threshold voltages. A memory device may have distributions that are narrow compared with the working range of control voltages tolerated by the cells of the device. Accordingly, multiple non-overlapping distributions ("valleys") may be fit into the working range allowing for storage and reliable detection of multiple values of the charge. The distributions (valleys) are interspersed with voltage intervals ("valley margins") where none (or very few) of the memory cells of the device have their threshold voltages. Such valley margins can, therefore, be used to separate various charge states—the logical state of the cell may be determined by detecting, during a read operation, between which two valley margins the respective threshold voltage $V_T$ of the cell resides. This effectively allows a single memory cell to store multiple bits of information: a memory cell operated with $2^{N-1}$ well-defined valley margins and $2^N$ valleys is capable of reliably storing N bits of information. Specifically, the read operation may be performed by comparing the measured threshold voltage $V_T$ exhibited by the memory cell to one or more reference voltage levels corresponding to known valley margins (e.g., centers of the margins) of the memory device.

One type of memory cell ("cell") is a single level cell (SLC), which stores 1 bit per cell and defines 2 logical states ("states") ("1" or "L0" and "0" or "L1") each corresponding to a respective $V_T$ level. For example, the "1" state may be an erased state and the "0" state may be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state may be an erased state and the "01", "10" and "00" states may each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state may be an erased state and each of the other states may be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell may use $2^n$ levels of charge to store n bits. A memory device may include one or more arrays of memory cells such as SLCs, MLCs, TLCs, QLCs, PLCs, etc. or any combination of such. For example, a memory device may include an SLC portion, and an MLC portion, a TLC portion, a QLC portion, or a PLC portion of memory cells.

A valley margin may also be referred to as a read window. For example, in a SLC cell, there is one read window that exists with respect to the two $V_T$ distributions. As another example, in an MLC cell, there are three read windows that exist with respect to the four $V_T$ distributions. As yet another example, in a TLC cell, there are seven read windows that exist with respect to the eight $V_T$ distributions. Read window size generally decreases as the number of states increases. For example, the one read window for the SLC cell may be larger than each of the three read windows for the MLC cell, and each of the three read windows for the MLC cell may be larger than each of the seven read windows for the TLC cell, etc. Read window budget (RWB) refers to the sum of the read windows.

Under certain circumstances, the memory device may be operated in an environment with varying temperatures. Even minor temperature variations over time, such as a period of time between when data is written to a memory device and when data is read from the memory device, may impact the charges stored in and read from the memory device, thus causing threshold voltage ($V_T$) shifts. Additionally, the minor temperature variations over time may affect $V_T$ distributions (e.g., widening of the $V_T$ distributions) of the memory cell causing read budget window degradation (e.g., loss). Additionally, as values of a chosen media endurance metric (e.g., the number of program-erase cycles (PEC)) grow with time, the effects of change in temperature between when the data is written and when the data is read from the memory device may intensify.

The difference in the temperature at the memory device measured at the time of writing the data ("programming temperature") and the temperature at the memory device measured at the time of reading the data ("operating temperature") may be referred to as the cross-temperature. Cross-temperature conditions occur, e.g., when a set of memory cells is programmed at a hot temperature range (e.g., exceeding a high temperature threshold) and read at a cold temperature range (e.g., below a low temperature threshold) or when the set of memory cells is programmed at a cold temperature range and read at a hot temperature range. The resulting $V_T$ shift may result in an increased raw bit error rate (RBER), which may be beyond the error correction capability of the underlying error correction code (ECC).

Aspects of the present disclosure address the above and other deficiencies by applying a voltage adjustment value to the bitline voltage to compensate for the read budget window degradation. In an illustrative example, responsive to receiving a read request with respect to a set of memory cells (e.g., a page) of a memory device, the memory sub-system controller may determine a value of a chosen media endurance metric of the set of memory cells. The media endurance metric may be represented, e.g., by the number of program-erase cycles (PEC) that have been performed with respect to the set of memory cells. The memory sub-system controller may further determine the cross-temperature, which reflects the difference between the programing temperature of the set of memory cells and the current operating temperature of the memory device.

Then, the memory sub-system controller may determine a voltage adjustment value corresponding to the combination of the media endurance metric value and the cross-temperature. In an illustrative example, the memory sub-system controller may identify, in a voltage adjustment data structure, the voltage adjustment value identified by the cross-temperature and the media endurance metric value. The voltage adjustment value may then be utilized for performing the requested read operation.

Therefore, advantages of the present disclosure include reducing the read budget window degradation caused by cross-temperature conditions, thus increasing the accuracy and reducing the latency of memory access operations.

FIG. 1 illustrates an example computing system 100 that includes a memory sub-system 110 in accordance with some implementations of the present disclosure. The memory sub-system 110 may include media, such as one or more volatile memory devices (e.g., memory device 140), one or more non-volatile memory devices (e.g., memory device 130), or a combination of such.

A memory sub-system 110 may be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 may be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 may include a host system 120 that is coupled to one or more memory sub-systems 110. In some implementations, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which may be an indirect communicative connection or direct communicative connection (e.g., without intervening components), whether wired or wireless, including connections such as electrical, optical, magnetic, etc.

The host system 120 may include a processor chipset and a software stack executed by the processor chipset. The processor chipset may include one or more cores, one or more caches, a memory controller (e.g., NVDIN controller), and a storage protocol controller (e.g., PCIe controller, SATA controller). The host system 120 uses the memory sub-system 110, for example, to write data to the memory sub-system 110 and read data from the memory sub-system 110.

The host system 120 may be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface may be used to transmit data between the host system 120 and the memory sub-system 110. The host system 120 may further utilize an NVM Express (NVMe) interface to access components (e.g., memory devices 130) when the memory sub-system 110 is coupled with the host system 120 by the physical host interface (e.g., PCIe bus). The physical host interface may provide an interface for passing control, address, data, and other signals between the memory sub-system 110 and the host system 120. FIG. 1 illustrates a memory sub-system 110 as an example. In general, the host system 120 may access multiple memory sub-systems via a same communication connection, multiple separate communication connections, and/or a combination of communication connections.

The memory devices 130, 140 may include any combination of the different types of non-volatile memory devices and/or volatile memory devices. The volatile memory devices (e.g., memory device 140) may be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells may perform bit storage based on a change of bulk resistance, in conjunction with a stackable cross-gridded data access array. Additionally, in contrast to many flash-based memories, cross-point non-volatile memory may perform a write in-place operation, where a non-volatile memory cell may be programmed without the non-volatile memory cell being previously erased. NAND type flash memory includes, for example, two-dimensional NAND (2D NAND) and three-dimensional NAND (3D NAND).

Each of the memory devices 130 may include one or more arrays of memory cells. One type of memory cell, for example, single level cells (SLC) may store one bit per cell. Other types of memory cells, such as multi-level cells (MLCs), triple level cells (TLCs), quad-level cells (QLCs), and penta-level cells (PLCs) may store multiple bits per cell. In some implementations, each of the memory devices 130 may include one or more arrays of memory cells such as SLCs, MLCs, TLCs, QLCs, PLCs or any combination of such. In some implementations, a particular memory device may include an SLC portion, and an MLC portion, a TLC portion, a QLC portion, or a PLC portion of memory cells. The memory cells of the memory devices 130 may be grouped as pages that may refer to a logical unit of the memory device used to store data. With some types of memory (e.g., NAND), pages may be grouped to form blocks.

Although non-volatile memory components such as a 3D cross-point array of non-volatile memory cells and NAND type flash memory (e.g., 2D NAND, 3D NAND) are described, the memory device 130 may be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) may communicate with the memory devices 130 to perform operations such as reading data, writing data, or erasing data at the memory devices 130 and other such operations. The memory sub-system controller 115 may include hardware such as one or more integrated circuits and/or discrete components, a buffer memory, or a combination thereof. The hardware may include a digital circuitry with dedicated (i.e., hard-coded) logic to perform the operations described herein. The memory sub-system controller 115 may be a microcontroller, special purpose logic circuitry (e.g., a field programmable gate array (FPGA), an application specific integrated circuit (ASIC), etc.), or other suitable processor.

The memory sub-system controller 115 may include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some implementations, the local memory 119 may include memory registers storing memory pointers, fetched data, etc. The local memory 119 may also include read-only memory (ROM) for storing micro-code. While the example memory sub-system 110 in FIG. 1 has been illustrated as including the memory sub-system controller 115, in another implementation of the present disclosure, a memory sub-system 110 does not include a memory sub-system controller 115, and may instead rely upon external control (e.g., provided by an external host, or by a processor or controller separate from the memory sub-system).

In general, the memory sub-system controller 115 may receive commands or operations from the host system 120 and may convert the commands or operations into instructions or appropriate commands to achieve the desired access to the memory devices 130. The memory sub-system controller 115 may be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 may further include host interface circuitry to communicate with the host system 120 via the physical host interface. The host interface circuitry may convert the commands received from the host system into command instructions to access the memory devices 130 as well as convert responses associated with the memory devices 130 into information for the host system 120.

The memory sub-system 110 may also include additional circuitry or components that are not illustrated. In some implementations, the memory sub-system 110 may include a cache or buffer (e.g., DRAM) and address circuitry (e.g., a row decoder and a column decoder) that may receive an address from the memory sub-system controller 115 and decode the address to access the memory devices 130.

In some implementations, the memory devices 130 include local media controllers 135 that operate in conjunction with memory sub-system controller 115 to execute operations on one or more memory cells of the memory devices 130. An external controller (e.g., memory sub-system controller 115) may externally manage the memory device 130 (e.g., perform media management operations on the memory device 130). In some implementations, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a memory access manager 113 that may apply a voltage adjustment value (from a bitline temperature compensation table stored in the memory sub-system) to a bitline voltage associated with a wordline to be read to compensate for read budget window degradation of one or more cells of the wordline. In some implementations, the memory sub-system controller 115 includes at least a portion of the memory access manager 113. In some implementations, the memory access manager 113 is part of the host system 110, an application, or an operating system. In other implementations, local media controller 135 includes at least a portion of memory access manager 113 and is configured to perform the functionality described herein.

The memory access manager 113 may, responsive to receiving a read request with respect to a set of memory cells (e.g., a page) of a memory device, determine a value of a chosen media endurance metric of the set of memory cells. The media endurance metric may be represented, e.g., by the number of program-erase cycles (PEC) that have been performed with respect to the set of memory cells. The current value of the media endurance metric may be maintained by the memory sub-system controller 115 or local media controller 135 and may be stored in a system data area of the memory device.

The memory access manager 113 may then determine the cross-temperature, which reflects the difference between the programing temperature of the set of memory cells and the current operating temperature of the memory device. The programming temperature for each set of memory cells (e.g., a block or a group of blocks) may be stored in a data structure residing in a system data area of the memory device and maintained by the memory sub-system controller 115 or local media controller 135. The current operating temperature may be obtained from a temperature sensor.

Upon determining the cross-temperature and the media endurance metric value, the memory access manager 113 may determine a voltage adjustment value corresponding to the combination of the media endurance metric value and the cross-temperature. In an illustrative example, the memory sub-system controller may identify, in a voltage adjustment data structure, the voltage adjustment value identified by the cross-temperature and the media endurance metric value. An example of voltage adjustment data structure is described herein below with reference to FIG. 2. The obtained voltage adjustment value may then be utilized for adjusting the bitline potential in performing the requested read operation.

For a given bitline, the bitline potential refers to the difference in the voltage at the source select gate (SGS) of the bitline and the voltage at the drain select gate (SGD) of the bitline. Thus, in order to adjust the bitline potential in performing a read operation, the memory access manager 113 may add the computed voltage adjustment value to the voltage to be applied to the SGS, the SGD, or both the SGS and the SGD (e.g., a portion of the default voltage adjustment value to the SGS and another portion of the default voltage adjustment value to the SGD).

Further details with regards to the operations of the memory access manager 113 are described below.

Figure 2:
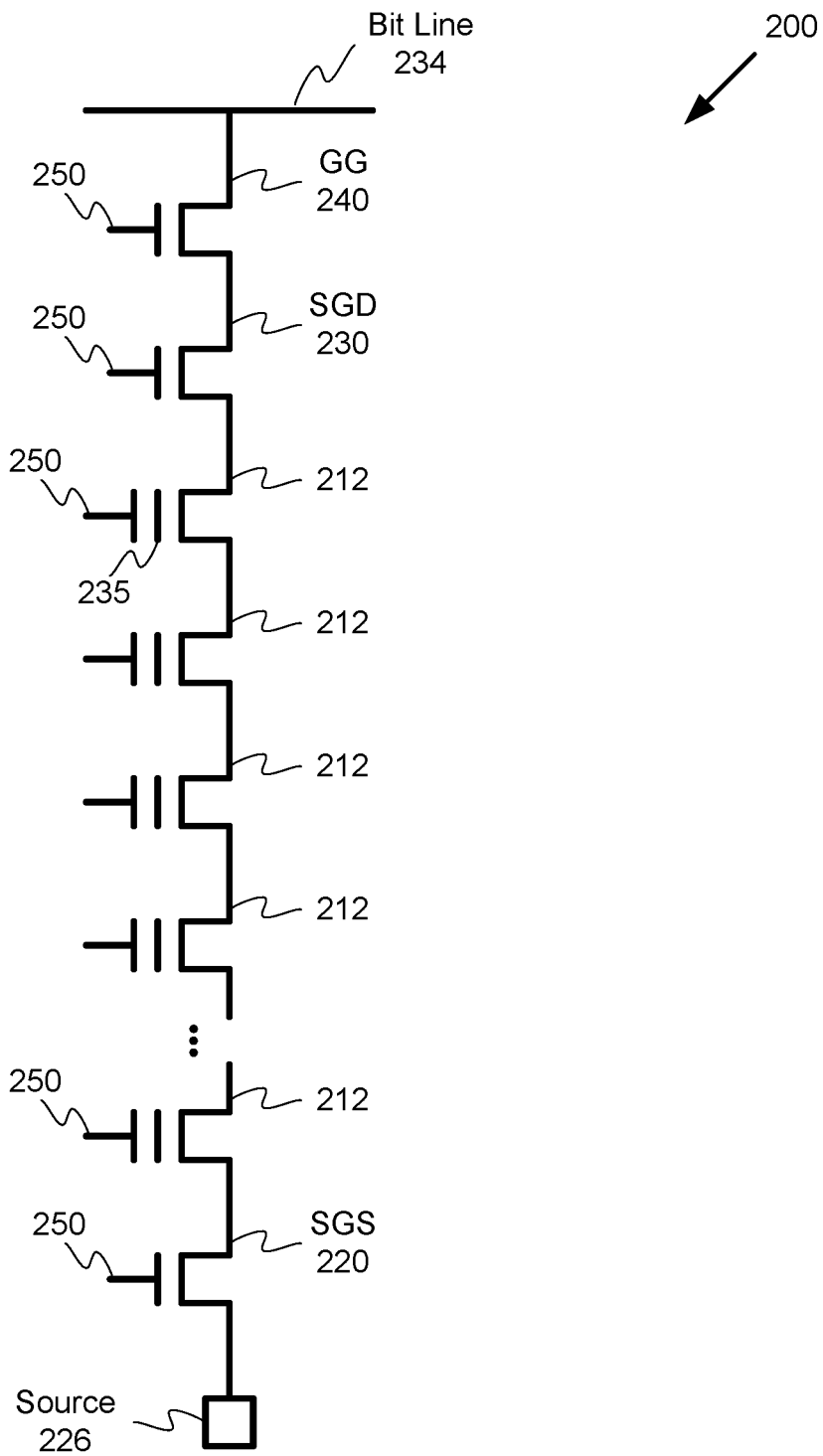
FIG. 2 is a schematic diagram illustrating a string of memory cells in a data block of a memory device in a memory sub-system in accordance with some implementations of the present disclosure.

FIG. 2 is a schematic diagram illustrating a string 200 of memory cells in a data block of a memory device in a memory sub-system in accordance with some implementations of the present disclosure. In some implementations, the string 200 is representative of one portion of memory device 130. The string 200 includes a number of memory cells 212 (i.e., charge storage devices), such as up to 32 memory cells (or more) in some implementations. Each of the memory cells 212 corresponds to a wordline. The string 200 includes a source-side select transistor known as a source select gate 220 (SGS) (typically an n-channel transistor) coupled between a memory cell 212 at one end of the string 200 and a common source 226. The common source 226 may include, for example, a commonly doped semiconductor material and/or other conductive material. At the other end of the string 200, a drain-side select transistor called a drain select gate 230 (SGD) (typically an n-channel transistor) and a gate induced drain leakage (GIDL) generator 240 (GG) (typically an n-channel transistor) are coupled between one of the memory cells 212 and a data line 234, which is commonly referred to in the art as a "bitline." The common source 226 may be coupled to a reference voltage (e.g., the ground voltage [Gnd]) or a voltage source (e.g., a charge pump circuit or power supply which may be selectively configured to a particular voltage suitable for optimizing a programming operation).

Each memory cell 212 may include, for example, a floating gate transistor or a charge trap transistor and may comprise a single level memory cell or a multilevel memory cell. The floating gate may be referred to as a charge storage structure 235. The memory cells 212, the source select gate 220, the drain select gate 230, and the GIDL generator 240 may be controlled by signals on their respective control gates 250.

The control signals may be applied by memory access manager 113, or at the direction of memory access manager 113, to select lines (not shown) to select strings (e.g., bitlines), or to access lines (not shown) to select memory cells 212 (e.g., wordlines), for example. In some cases, the control gates may form a portion of the select lines (for select devices) or access lines (for cells). The drain select gate 230 receives a voltage that may cause the drain select gate 230 to select or deselect the string 200. In some implementations, each respective control gate 250 is connected to a separate word line (i.e., access line), such that each device or memory cell may be separately controlled.

As noted herein above, due to cross-temperature conditions a read budget window associated with a set of memory cell (e.g., a page) may degrade, thus causing increased errors during read operations. Such temperature-driven degradation intensifies as the number of program-erase cycles of the memory device increases.

Accordingly, in some implementations, memory access manager 113 mitigates the read budget window degradation caused by cross-temperature and wear of the memory cell 212 by applying, during a read operation, a voltage adjustment value to the source select gate 220 and/or the drain select gate 230, thus adjusting the bitline potential.

As noted herein above the memory sub-system controller may maintain a voltage adjustment data structure utilized for mapping cross-temperature and the media endurance metric values to voltage adjustments.

FIG. 3 schematically illustrates an example voltage adjustment data structure 300 implemented in accordance with aspects of the present disclosure. The example voltage adjustment data structure 300 may be represented by a two-dimensional table. One of the dimensions (e.g., the columns) of the data structure 300 correspond to different ranges of the chosen media endurance metric (e.g., the number of PEC cycles). In some implementations, each column may have a specific value of the media endurance metric associated with it, and interpolation may be performed if the measured value of the metric does not match any of the column values. Alternatively, each column may have a corresponding range of values of the media endurance metric associated with it. In an illustrative example, one range of values may correspond to the beginning of life of a memory device, while another range of values may correspond to the end of life of the memory device. In other example, various other numbers of ranges may be employed.

Conversely, another dimension (e.g., the rows) of the data structure 300 correspond to different ranges of the cross-temperature (e.g., the difference between the operating temperature during the read operation with respect to a set of memory cells and the programming temperature associated with the set of memory cells). In an illustrative example, each row may have a specific value of the cross-temperature associated with it, and interpolation may be performed if the measured value of the metric does not match any of the row values. In another illustrative example, each row may have a corresponding range of values of the cross-temperature associated with it. In yet another illustrative example, the programming and operating temperature values utilized to compute the cross-temperature may be translated to respective ranges of a predefined set of ranges (e.g., "hot" exceeding a predefined threshold and "cold" falling below the threshold), and the rows of the data structure 300 may be characterized by a combination of the two intervals corresponding to the programming and operating temperature (e.g., "cold-to-cold," "cold-to-hot," "hot-to-hot," and "hot-to-cold").

Accordingly, each cell of the voltage adjustment data structure 300, which is identified by an intersection of a row and a column, stores the voltage adjustment corresponding to the combination of the media endurance metric value associated with the column the and the cross temperature associated with the row.

While in the illustrative example of FIG. 3 the voltage adjustment data structure 300 is shown as a two-dimensional table, in various other implementations, other types of data structures, such as linear arrays or multi-dimensional arrays, can be employed.

The bitline temperature compensation data structure 300 may be generated using a representative data set reflecting various media endurance metric values and cross-temperature. For each combination of the media endurance metric value and cross-temperature, the read voltage adjustment can be identified that, when applied in a read operation, would produce the optimal value of a chosen data state metric (e.g., RBER). In some implementations, the voltage adjustments to be applied at a given cross-temperature are gradually increasing with the increase in the media endurance metric values (e.g., towards the end of life of the memory device).

Figure 4:
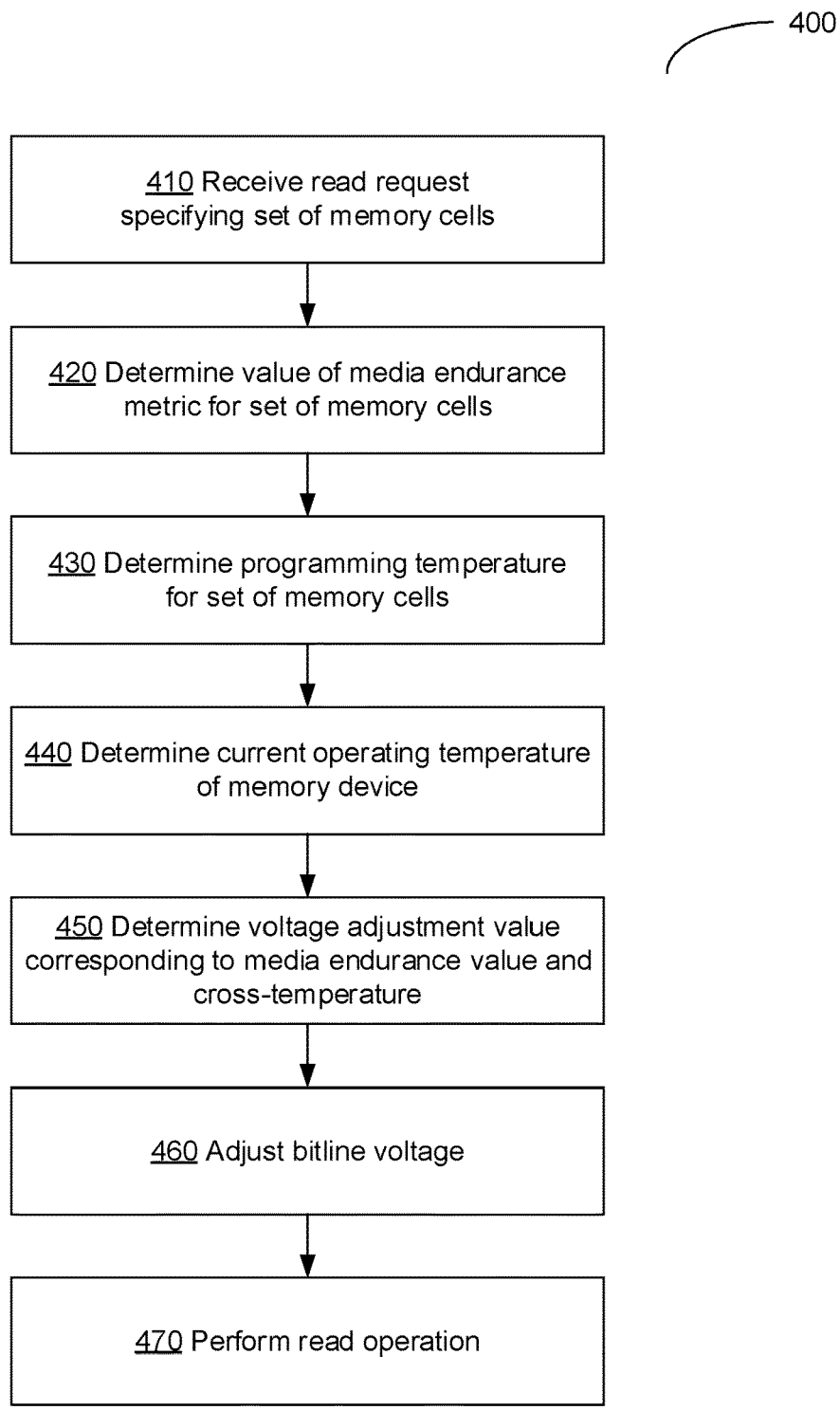
FIG. 4 is a flow diagram of an example method for performing read operation, in accordance with some implementations of the present disclosure.

FIG. 4 is a flow diagram of an example method 400 for performing read operation, in accordance with some implementations of the present disclosure. The method 400 may be performed by processing logic that may include hardware (e.g., processing device, circuitry, dedicated logic, programmable logic, microcode, hardware of a device, integrated circuit, etc.), software (e.g., instructions run or executed on a processing device), or a combination thereof. In some implementations, the method 400 is performed by the memory access manager 113 of FIG. 1. Although shown in a particular sequence or order, unless otherwise specified, the order of the operations may be modified. Thus, the illustrated implementations should be understood only as examples, and the illustrated operations may be performed in a different order, and some operations may be performed in parallel. Additionally, one or more operations may be omitted in various implementations. Thus, not all operations are required in every implementation.

At operation 410, the processing device implementing the method receives a read request specifying a set of memory cells (e.g., a page) of a memory device, as described in more detail herein above.

At operation 420, the processing device determines the value of a chosen media endurance metric for the set of memory cells, as described in more detail herein above.

At operation 430, the processing device determines the programing temperature associated with the set of memory cells, as described in more detail herein above.

At operation 440, the processing device determines the current operating temperature of the memory device, as described in more detail herein above.

At operation 450, the processing device determines the voltage adjustment value corresponding to the combination of the value of the media endurance metric, the programming temperature, and the current operating temperature, as described in more detail herein above.

At operation 460, the processing device adjusts, by the voltage adjustment value, a bitline voltage applied to a bitline associated with the set of memory cells. In an illustrative example, the processing device may add the voltage adjustment value to a default bitline voltage value, as described in more detail herein above.

At operation 470, the processing device performs, using the adjusted bitline voltage, a read operation with respect to the set of memory cells, as described in more detail herein above. Upon performing the operation 470, the method terminates.

Figure 5:
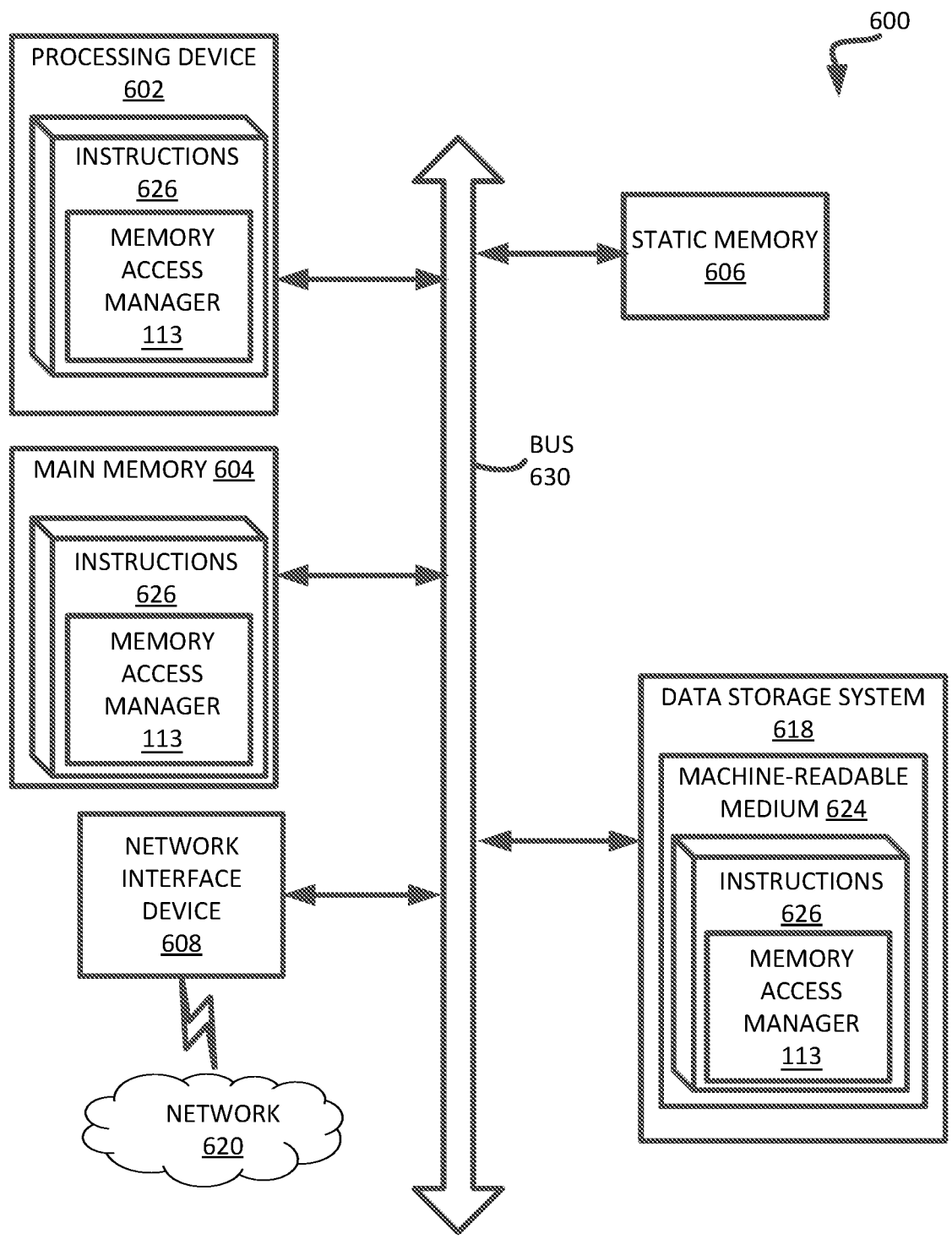
FIG. 5 is a block diagram of an example computer system in which implementations of the present disclosure may operate.

FIG. 5 illustrates an example machine of a computer system 600 within which a set of instructions, for causing the machine to perform any one or more of the methodologies discussed herein, may be executed. In some implementations, the computer system 600 may correspond to a host system (e.g., the host system 120 of FIG. 1) that includes, is coupled to, or utilizes a memory sub-system (e.g., the memory sub-system 110 of FIG. 1) or may be used to perform the operations of a controller (e.g., to execute an operating system to perform operations corresponding to the memory access manager 113 of FIG. 1). In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 may further include a network interface device 608 to communicate over the network 620.

The data storage system 618 may include a machine-readable storage medium 624 (also known as a computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 may correspond to the memory sub-system 110 of FIG. 1.

In some implementations, the instructions 626 include instructions to implement functionality corresponding to a bitline temperature compensation component (e.g., the memory access manager 113 of FIG. 1). While the machine-readable storage medium 624 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure may refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus may be specially constructed for the intended purposes, or it may include a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). In some implementations, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, implementations of the disclosure have been described with reference to specific example implementations thereof. It will be evident that various modifications may be made thereto without departing from the broader spirit and scope of implementations of the disclosure as set forth in the following claims. The specification and drawings are, accordingly, to be regarded in an illustrative sense rather than a restrictive sense.

What is claimed is:

1. A method comprising:
  receiving, by a processing device, a read request with respect to a set of memory cells of a memory device;
  determining a value of a media endurance metric of the set of memory cells;
  determining a programing temperature associated with the set of memory cells;
  determining a current operating temperature of the memory device;
  obtaining, from a voltage adjustment data structure, a voltage adjustment value based on the value of the media endurance metric and a cross-temperature derived from the programming temperature and the current operating temperature, wherein each voltage adjustment value of voltage adjustment data structure is generated using a representative data set reflecting various values of media endurance metric and cross-temperature;
  adjusting, by the voltage adjustment value, a bitline voltage applied to a bitline associated with the set of memory cells; and
  performing, using the adjusted bitline voltage, a read operation with respect to the set of memory cells.

2. The method of claim 1, wherein the media endurance metric is represented by a number of program erase cycles (PECs) of the set of memory cells.

3. The method of claim 1, wherein adjusting the bitline voltage further comprises:
  applying the voltage adjustment value to a source-side voltage applied to a source-side of the bitline.

4. The method of claim 1, wherein adjusting the bitline voltage further comprises:
  applying the voltage adjustment value to a drain-side voltage applied to a drain-side of the bitline.

5. The method of claim 1, wherein obtaining the voltage adjustment value further comprises:
  identifying, in the voltage adjustment data structure, an entry identified by a cross-temperature associated with the set of memory cells and the value of the media endurance metric, wherein the cross-temperature reflects a difference between the programming temperature and the operating temperature.

6. The method of claim 1, wherein the set of memory page is provided by one of: a page or a block of the memory device.

7. The method of claim 1, wherein determining the value of the media endurance metric is performed using a metadata record associated with the set of memory cells.

8. The method of claim 1, wherein determining the programing temperature is performed using a metadata record associated with the set of memory cells.

9. A system comprising:
  a memory device; and
  a processing device, operatively coupled to the memory device, the processing device to perform operations comprising:
    receiving a read request with respect to a set of memory cells of a memory device;
    determining a value of a media endurance metric of the set of memory cells;
    determining a programing temperature associated with the set of memory cells;
    determining a current operating temperature of the memory device;
    obtaining, from a voltage adjustment data structure, a voltage adjustment value based on the value of the media endurance metric and a cross-temperature derived from the programming temperature and the current operating temperature, wherein each voltage adjustment value of voltage adjustment data structure is generated using a representative data set reflecting various values of media endurance metric and cross-temperature;
    adjusting, by the voltage adjustment value, a bitline voltage applied to a bitline associated with the set of memory cells; and
    performing, using the adjusted bitline voltage, a read operation with respect to the set of memory cells.

10. The system of claim 9, wherein the media endurance metric is represented by a number of program erase cycles (PECs) of the set of memory cells.

11. The system of claim 9, wherein adjusting the bitline voltage further comprises:
  applying the voltage adjustment value to a source-side voltage applied to a source-side of the bitline.

12. The system of claim 9, wherein adjusting the bitline voltage further comprises:
  applying the voltage adjustment value to a drain-side voltage applied to a drain-side of the bitline.

13. The system of claim 9, wherein obtaining the voltage adjustment value further comprises:
  identifying, in the voltage adjustment data structure, an entry identified by a cross-temperature associated with the set of memory cells and the value of the media endurance metric, wherein the cross-temperature reflects a difference between the programming temperature and the operating temperature.

14. The system of claim 9, wherein determining the value of the media endurance metric is performed using a metadata record associated with the set of memory cells.

15. The system of claim 9, wherein determining the programing temperature is performed using a metadata record associated with the set of memory cells.

16. A non-transitory computer readable storage medium including instructions that, when executed by a processing device, cause the processing device to perform a method comprising:
  receiving, by a processing device, a read request with respect to a set of memory cells of a memory device;

determining a value of a media endurance metric of the set of memory cells;

determining a programing temperature associated with the set of memory cells;

determining a current operating temperature of the memory device;

obtaining, from a voltage adjustment data structure, a voltage adjustment value based on the value of the media endurance metric and a cross-temperature derived from the programming temperature and the current operating temperature, wherein each voltage adjustment value of voltage adjustment data structure is generated using a representative data set reflecting various values of media endurance metric and cross-temperature;

adjusting, by the voltage adjustment value, a bitline voltage applied to a bitline associated with the set of memory cells; and performing, using the adjusted bitline voltage, a read operation with respect to the set of memory cells.

17. The non-transitory computer readable storage medium of claim 16, wherein the media endurance metric is represented by a number of program erase cycles (PECs) of the set of memory cells.

18. The non-transitory computer readable storage medium of claim 16, wherein adjusting the bitline voltage further comprises:

applying the voltage adjustment value to one of: a source-side voltage applied to a source-side of the bitline or a drain-side voltage applied to a drain-side of the bitline.

19. The non-transitory computer readable storage medium of claim 16, wherein determining the voltage adjustment value further comprises:

identifying, in a voltage adjustment data structure, an entry identified by a cross-temperature associated with the set of memory cells and the value of the media endurance metric, wherein the cross-temperature reflects a difference between the programming temperature and the operating temperature.

20. The non-transitory computer readable storage medium of claim 16, wherein the set of memory page is provided by one of: a page or a block of the memory device.

* * * * *